United States Patent [19]

Koide et al.

[11] Patent Number: 5,408,137
[45] Date of Patent: Apr. 18, 1995

[54] OUTPUT DRIVER CIRCUIT WITH HIGH BREAKDOWN VOLTAGE

[75] Inventors: Nobuo Koide, Edogawa; Masaji Ueno, Chofu, both of Japan

[73] Assignee: Kabushiki Kaisha Toshiba, Kawasaki, Japan

[21] Appl. No.: 159,213

[22] Filed: Nov. 30, 1993

[30] Foreign Application Priority Data

Nov. 30, 1992 [JP] Japan .................. 4-320476

[51] Int. Cl.⁶ .......................................... H03K 17/60
[52] U.S. Cl. ..................................... 327/108; 327/432; 327/542
[58] Field of Search .................. 307/270, 296.1, 296.2, 307/296.4, 296.7, 296.8, 570, 572, 584

[56] References Cited

U.S. PATENT DOCUMENTS

| | | | |
|---|---|---|---|
| 4,786,827 | 11/1988 | Gariboldi et al. | 307/270 |
| 5,245,230 | 9/1993 | Ohri et al. | 307/296.4 |

*Primary Examiner*—Timothy P. Callahan
*Assistant Examiner*—Jeffrey Zweizig
*Attorney, Agent, or Firm*—Foley & Lardner

[57] ABSTRACT

A driver circuit suitable for use to secure output characteristics higher than the element breakdown voltage in an output circuit. The driver circuit includes first and second switching elements connected between a first supply voltage and an outward terminal for driving a load, a relaxation voltage applying section for applying a voltage lower than the first supply voltage to a junction point between the first and second switching elements and a back gate of the second switching element, and a control section for turning on the second switching element and then the first switching element in sequence when the driver circuit is turned on, and turning off the first switching element and then the second switching element in sequence when the driver circuit is turned off.

20 Claims, 4 Drawing Sheets

OUTPUT DRIVER CIRCUIT WITH HIGH BREAKDOWN VOLTAGE

FIELD OF THE INVENTION

The present invention relates to a driver circuit, and more specifically to a driver circuit suitable for use to secure output characteristics higher than the element breakdown voltage in an output circuit, under consideration of a drop of breakdown voltage due to microminiaturization of semiconductor elements.

BACKGROUND OF THE INVENTION

FIG. 4 is a circuit diagram of an example of conventional driver circuits, which shows a configuration of a source type driver circuit, in particular. In the following description, the reference symbol M denotes a field effect transistor and Q denotes a bipolar transistor. As shown in FIG. 4, a high potential supply voltage Vcc (e.g., 5 V) is supplied to a supply voltage terminal VCC of an integrated circuit IC to drive a plurality of external circuits through driver output terminals D1, D2, D3, . . . , respectively. Here, for instance, the driver output terminal D3 is connected to the base of a PNP type bipolar transistor Q14 whose collector is connected to an output terminal Out4. The emitter of this transistor Q14 is connected to the high potential supply voltage Vcc and the base thereof is connected to the same high potential supply voltage Vcc through a resistor R14. Further, a load resistance RL is connected as a load to the output terminal Out4 connected to the collector of the transistor Q14. Further, the transistor Q14, the resistor R14 and the output terminal Out4 are all discrete parts connected as an external circuit of the integrated circuit IC.

The operation of the circuit as shown in FIG. 4 will be described hereinbelow. The integrated circuit IC is a circuit formed by integrating a plurality of functional elements, which executes predetermined various functions internally on the basis of the high potential supply voltage Vcc supplied to the supply voltage terminal VCC. When the integrated circuit IC outputs drive signals (e.g., displaying, printing, driving, etc.) to the outside, these drive signals are outputted through the driver output terminals D1, D2, D3, . . . , respectively.

In this case, if a driven element connected to the driver output terminal D3 of the integrated circuit IC is a load resistance RL, for instance and further the driving capability of the driver output terminal D3 is enough to drive the load resistance RL, it is possible to directly connect the load resistance RL to the output terminal D3 in such a way that a required driving current can be supplied directly from the integrated circuit IC to the load resistance RL.

In practice, however, there exist some cases where the driving capability of the driver output terminal D of the integrated circuit IC is not enough to drive the load resistance RL directly due to the microminiaturization of the integrated circuit IC. In this case, it is necessary to connect an additional driver circuit composed of discrete parts externally to the integrated circuit IC.

That is, the transistor Q14 is connected to the driver output terminal D3 for the purpose as described above. Here, when the driver output terminal D3 is at a high level, the base of the transistor Q14 is held at the high potential supply voltage Vcc through the resistor R14, so that the transistor Q14 is kept turned off. As a result, no current is supplied from the output terminal Out4 to the load resistance RL. In contrast with this, when the driver output terminal D3 changes to a low level, a base current flows from the emitter to the base of the transistor Q14 toward the driver output terminal D3, so that the transistor Q14 is turned on. As a result, a load current flows from the high potential supply voltage Vcc to the load resistance RL through the transistor Q14 and the output terminal Out4. In other words, as far as the output terminal D3 of the integrated circuit IC is provided with a base current absorbing capability sufficient to turn on the transistor Q14, it is possible to drive the load resistance RL.

As described above, in the circuit as described above, the capability of each of the driver output terminals D1, D2 and D3 of the integrated circuit IC is such an extent as to activate each of the external PNP transistors. In other words, since it is unnecessary for the integrated circuit IC to drive other circuits directly, a high breakdown voltage is not required for the integrated circuit. On the other hand, since the PNP transistor connected externally is a discrete part, there exists no problem with respect to the breakdown voltage of the transistor. Accordingly, this method of increasing the driving capability of the integrated circuit IC by connecting discrete parts externally thereto has been so far widely adopted to improve the driving capability of the integrated circuits.

On the other hand, however, since the PNP transistor is low in current amplification factor $h_{fe}$, it is necessary to supply a sufficiently large base current to the transistor in order to obtain a large driving current. However, when a large driving current is supplied from the output terminal Out4 to the load resistance RL, since the current flowing through the driver output terminals D1, D2, D3, . . . of the integrated circuit IC also increases, there exists a problem in that the power consumption of the integrated circuit IC inevitably increases. In addition, since discrete parts must be connected externally, there exists another problem in that the circuit configuration is complicated externally and the size thereof increases.

To overcome these problems, a source type driver circuit is well known such that the load can be directly driven by turning on or off a transistor provided in the integrated circuit itself. FIG. 5 shows an example of the conventional driver circuits as described above. In FIG. 5, two N-channel MOS transistors M15 and M 25 are connected in series to each other. The source of the transistor M25 is grounded. The drain of the transistor M15 is connected to a supply voltage VDD via a resistance R15 and further to the gate of a P-channel transistor M35. The source of the transistor M35 is connected to the supply voltage VDD, and the drain thereof is connected to an output terminal Out. A load resistance RL is connected to the output terminal Out as a load.

The circuit shown in FIG. 5 is integrated together with another integrated circuit. The gate of the transistor M35 is controlled by controlling the gates of the series-connected transistors M15 and M25 on the basis of the internal operation of the integrated circuit. That is, when the two transistors M15 and M25 are kept turned off, since the supply voltage VDD is applied to the gate of the transistor M35 through the resistance R15, the transistor M35 is turned off, so that no current flows through the load resistance RL connected to the output terminal Out. On the other hand, when the two transistors M15 and M25 are turned on, since the gate of the transistor M35 is set to the ground level in potential through the resistance R15, the transistor M35 is turned on, so that a drive current flows from the supply voltage VDD to the load resistance RL through the transistor M35 and the output terminal Out.

In the above-mentioned driver circuit constructed as shown in FIG. 5, since an external driver circuit composed of discrete parts is not connected to the integrated circuit, the load resistance RL can be driven directly by the transistor M35 formed in the integrated circuit, with the result that there exists such an advantage that the circuit configuration can be simplified. On the other hand, however, since a higher voltage (an addition of the supply voltage VDD and another voltage (e.g., supply voltage) of the integrated circuit) is applied to the transistor M35 when the transistor M35 is kept turned off, there exists a problem in that the transistor M35 must be high in breakdown voltage.

SUMMARY OF THE INVENTION

With these problems in mind, therefore, the object of the present invention is to provide a driver circuit of source-type driver which can be formed in an integrated circuit, by use of P-channel MOS transistors as the basic device, without increasing the device breakdown voltage which is required when external discrete parts are omitted.

To achieve the above-mentioned object, the present invention provides a driver circuit comprising: first and second switching means connected between a first supply voltage and an output terminal for driving a load, in the order of first and second switching means; relaxation voltage applying means for applying a voltage lower than the first supply voltage to a junction point between said first and second switching means and a back gate of said second switching means; and control means for turning on said second switching means and then said first switching means in sequence when the driver circuit is turned on, and turning off said first switching means and then said second switching means in sequence when the driver circuit is turned off.

The control means comprises a comparing circuit for comparing a voltage at the output terminal with a predetermined reference voltage, said first switching means being turned on when said second switching means is inverted in response to an output voltage of said comparing circuit. The control means enables said relaxation voltage applying means to apply the relaxation voltage, prior to the turning-on of said second switching means, when the driver circuit is turned on; and disables said relaxation voltage applying means from applying the relaxation voltage, after the driver circuit has been turned on.

The relaxation voltage applying means comprises circuit elements and third switching means connected in series between a high supply voltage side and a low supply voltage side, the relaxation voltage being generated or interrupted whenever said third switching means is turned on or off by said control means. The relaxation voltage applying means is composed of first and second resistor means and said third switching means connected in series between the high supply voltage side and the low supply voltage side, a junction point between said first and second resistor means being connected to a control terminal of fourth switching means connected between the high supply voltage side and the junction point between said first and second switching means.

Further, the driver circuit comprises fifth switching means connected between said second resistor means and said third switching means, a second supply voltage lower than the first supply voltage being connected to a control terminal of said fifth switching means. Further, the driver circuit comprises reverse bias voltage application preventing means connected between the junction point between said first and second switching means and the junction point between said first and second resistor means, for preventing a reverse bias voltage from being applied to said fourth switching means.

In the driver circuit according to the present invention, when a plurality of field effect switching elements are turned on to drive a load connected to the output terminal, it is possible to prevent an excessive voltage higher than the breakdown voltage of the switching element from being applied to each of the switching elements, by application of a potential lower than the supply voltage to the back gate and the drain of at least one switching element. In this case, the voltage generating (relaxation voltage applying) means is controlled by turning on or off the switching elements stepwise through the control means.

DETAILED DESCRIPTION OF THE PREFERRED EMBODIMENTS

Figure 1:
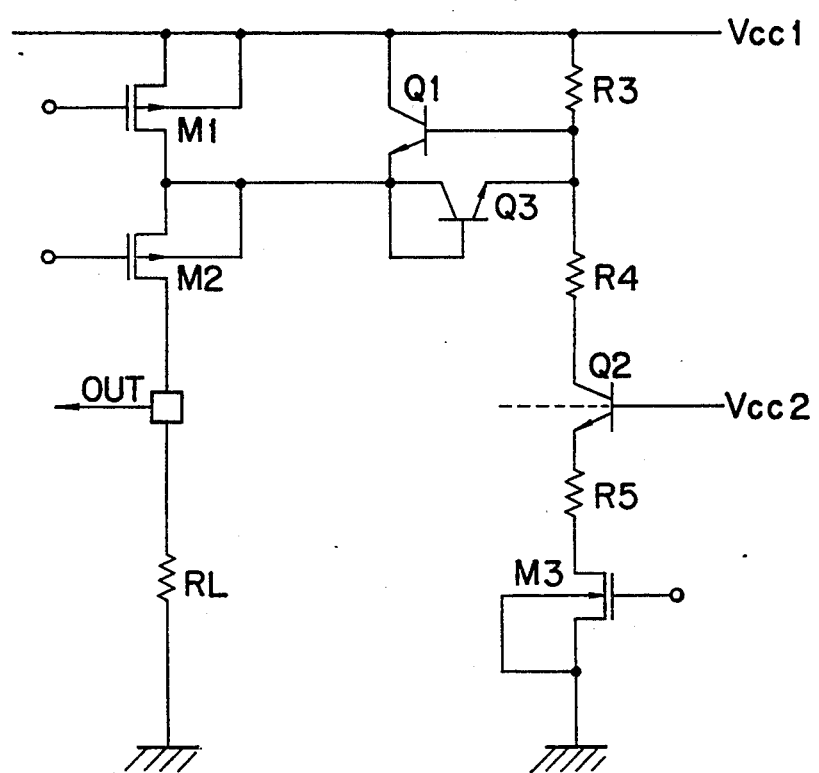
FIG. 1 is a circuit diagram showing a first embodiment of the driver circuit device according to the present invention.

Embodiments of the driver circuit according to the present invention will be described hereinbelow with reference to the attached drawings. FIG. 1 shows a first embodiment of the present invention.

In FIG. 1, the driver circuit comprises two P-channel transistors M1 and M2, an N-channel transistor M3, three bipolar transistors Q1, Q2 and Q3, resistances, etc. The two P-channel transistors M1 and M2 are connected in series to each other. The source of the transistor M1 is connected to a high potential supply voltage Vcc1. The drain of the transistor M1 and the source of the transistor M2 are connected mutually. The drain of the transistor M2 is connected to an output terminal Out. A load resistance RL is connected between the output terminal Out and the ground. On the other hand, a control signal from an integrated circuit (not shown) is supplied to the gate of the N-channel transistor M3. The source of the transistor M3 is connected to the ground, and the drain thereof is connected to the emitter of the transistor Q2 through a resistance R5. The base of the transistor Q2 is connected to another high potential supply voltage Vcc2 (lower than the supply voltage Vcc1), and the collector thereof is connected to the high potential supply voltage Vcc1 through two resistances R3 and R4. A junction point between the two resistances R3 and R4 is connected to the base of the transistor Q1 and the emitter of the transistor Q3. The collector of the transistor Q1 is connected to the high potential supply voltage Vcc1, and the emitter thereof is connected to the collector and the base of the transistor Q3. Further, the emitter of the transistor Q1 is connected to the source of the transistor M2 and the drain of the transistor M1, respectively.

Here, the high potential supply voltage Vcc1 is 12 volts, and the high potential supply voltage Vcc2 is 5 volts, for instance. The resistance R5 is a protective resistance for the transistor Q2 effective when the transistor M3 is turned on. The resistances R3 and R4 serve to reduce the drain (back gate) potential of the transistor M2 down to a value lower than the breakdown voltage thereof. The relationship between the three resistances R3, R4 and R5 are determined as follows:

$$R3 \approx R4 > R5 \qquad (1)$$

The operation of the driver circuit as described above will be described hereinbelow.

Here, the operation will be explained hereinbelow from when no drive current is supplied from the output terminal Out to the load resistance RL to when a drive current is supplied from the output terminal Out to the load resistance RL. In this case, the three transistors M1, M2 and M3 are turned on in the following sequence on the basis of logical operation of the integrated circuit.

(1) At the initial stage, only the transistor M3 is turned on, and the two transistors M1 and M2 are both kept turned off, so that the driver operation is kept deactivated.

(2) At the first stage, the transistor M2 is turned on in addition to the transistor M3, while keeping the transistor M1 turned off.

(3) At the succeeding second stage, the transistor M1 is turned on in addition to the transistor M2, to activate the driver operation, while the transistor M3 is turned off.

At the initial stage (driver-off status), since only the transistor M3 is turned on, a base current of the transistor Q2 flows through the emitter thereof through the resistance R5 and the turned-on transistor M3, so that current flows through the three resistances R3, R4 and R5. In this case, the potential at the junction point between the resistance R4 and the collector of the transistor Q2 becomes roughly equal to the high potential supply voltage Vcc2. Accordingly, the potential Vbg at the junction point between the two resistances R3 and R4 becomes as follows:

$$Vbg \approx (Vcc1 - Vcc2)/2 + Vcc2 \qquad (2)$$

This voltage is given to the base of the transistor Q1, so that a voltage obtained by subtracting the base-emitter voltage of the transistor Q1 from the potential Vbg (i.e., roughly equal to the potential Vbg) is applied to the emitter of the transistor Q1. This voltage is applied to the source (back gate) of the transistor M2. Under these conditions, the following voltage is applied between the source and the drain of the transistor M1:

$$VM1 \approx Vcc1 - (Vbg - V_{BEQ1}) \qquad (3)$$

where $V_{BEQ1}$ denoted the base-emitter voltage of the transistor Q1.

Further, the following voltage is applied between the source and the drain of the transistor M2:

$$VM2 \approx Vbg - V_{BEQ1} \qquad (4)$$

Accordingly, it is possible to reduce the potential applied to the transistors M1 and M2 which function directly as a driver circuit, thus solving the problem related to the breakdown voltage of the transistors M1 and M2.

Further, at the first stage, since the transistors M2 and M3 are both turned on, the drain voltage of the transistor M2 is outputted to the output terminal Out as it is. In other words, the voltage Vbg is applied to the load resistance RL. Under these conditions, since the voltage between the source and the drain of the transistor M1 is kept unchanged, there exists no problem with respect to the breakdown voltage of the transistor M1.

At the succeeding second stage (driver-on status), since the transistors M1 and M2 are both turned on, a voltage obtained by subtracting an addition of two voltage drops due to two turn-on resistances (each between the source-drain) of the two transistors M1 and M2 from the high potential supply voltage Vcc1 is applied to the output terminal Out, so that a load current flows through the load resistance RL. Under these conditions, since two transistors M1 and M2 are both turned on, it is unnecessary to supply the voltage Vbg to the transistor M2. Further, the transistor M3 is turned off.

Here, the transistor Q3 severs to prevent a reverse bias voltage from being applied between the emitter and the base of the transistor Q1.

On the other hand, the operation will be explained hereinbelow from when a drive current is supplied from the output terminal Out to the load resistance RL to when no drive current is supplied from the output terminal Out to the load resistance RL. In this case, the operation sequence described above is reversed; that is, the transistor M3 is turned on and the transistors M1 and M2 are both turned off in sequence. In this operation, it is possible to prevent a high potential supply voltage for driving the load resistance RL from being applied directly to the transistors M1 and M2.

Figure 2:
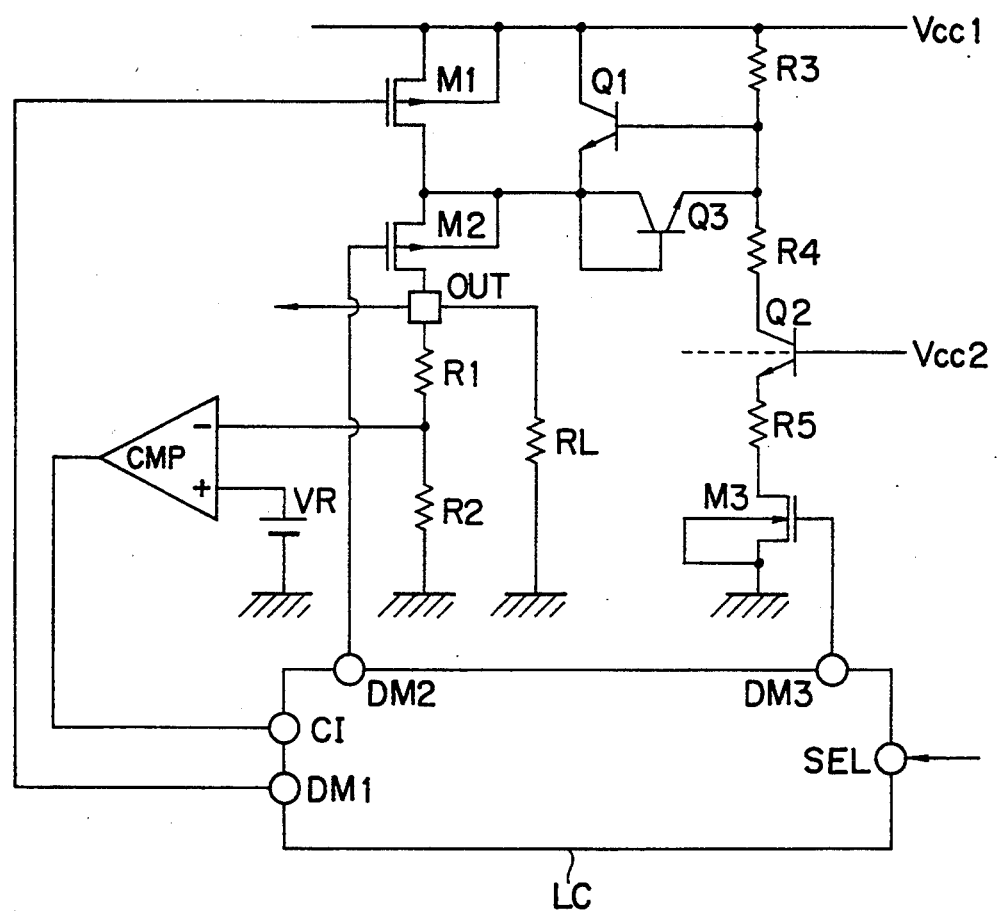
FIG. 2 is a circuit diagram showing a second embodiment of the driver circuit device according to the present invention.

FIG. 2 shows a second embodiment of the driver circuit according to the present invention. In FIG. 2, the driver circuit further comprises two resistances R1 and R2, a comparator CMP, a logical circuit LC, etc. in addition to the elements shown in FIG. 1. In the drawing, the two series-connected resistance R1 and R2 for detecting a voltage are connected in parallel to the load resistance RL. A voltage at the junction point between the two resistances R1 and R2 is applied to an inversion input terminal of the comparator (an operational amplifier) CMP. Further, a reference voltage of a reference supply voltage VR is applied to an non-inversion input terminal of the same comparator CMP. The comparator CMP compares the voltage at the junction between the two resistances R1 and R2 with the reference voltage, and inputs the compared result to an comparator input terminal CI of the logical circuit LC. The logical circuit LC controls the gates of the transistors M1, M2 and M3 through three output terminals DM1, DM2 and DM3 on the basis of the conditions inputted to the comparator input terminal CI and the activation or deactivation conditions inputted to the select terminal SEL.

The operation of the driver circuit as shown in FIG. 2 will be described hereinbelow.

In the deactivation status, the logical circuit LC turns off both the transistors M1 and M2 and turns on only the transistor M3 through the three output terminals DM1, DM2 and DM3. Under these conditions, since only a voltage lower than the high potential supply voltage Vcc1 is applied to the transistors M1 and M2, as already described with reference to FIG. 1, there exists no problem with respect to the breakdown voltage of the transistors M1 and M2.

Under these conditions, when a drive command signal is applied to the select terminal SEL of the logical circuit LC, the logical circuit LC turns on the transistor M2 through the output terminal DM2. In this case, the voltage Vbg develops at the output terminal Out. This voltage Vbg is divided by the resistor R1 and R2, and then given to the comparator CMP. The comparator CMP compares the voltage divided by the two resistances R1 and R2 with the reference voltage VR to inverse the output of the comparator CMP. As a result, the logical circuit LC turns on the transistor M1 through the output terminal DM1. Since the two transistors M1 and M2 are both turned on, a drive current is supplied from the high potential supply voltage Vcc1 to the load resistance RL through the output terminal Out. Further, after the two transistors M1 and M2 have been both turned on, since it is unnecessary to supply the voltage Vbg to the transistor M2, the transistor M3 is turned off.

Figure 3:
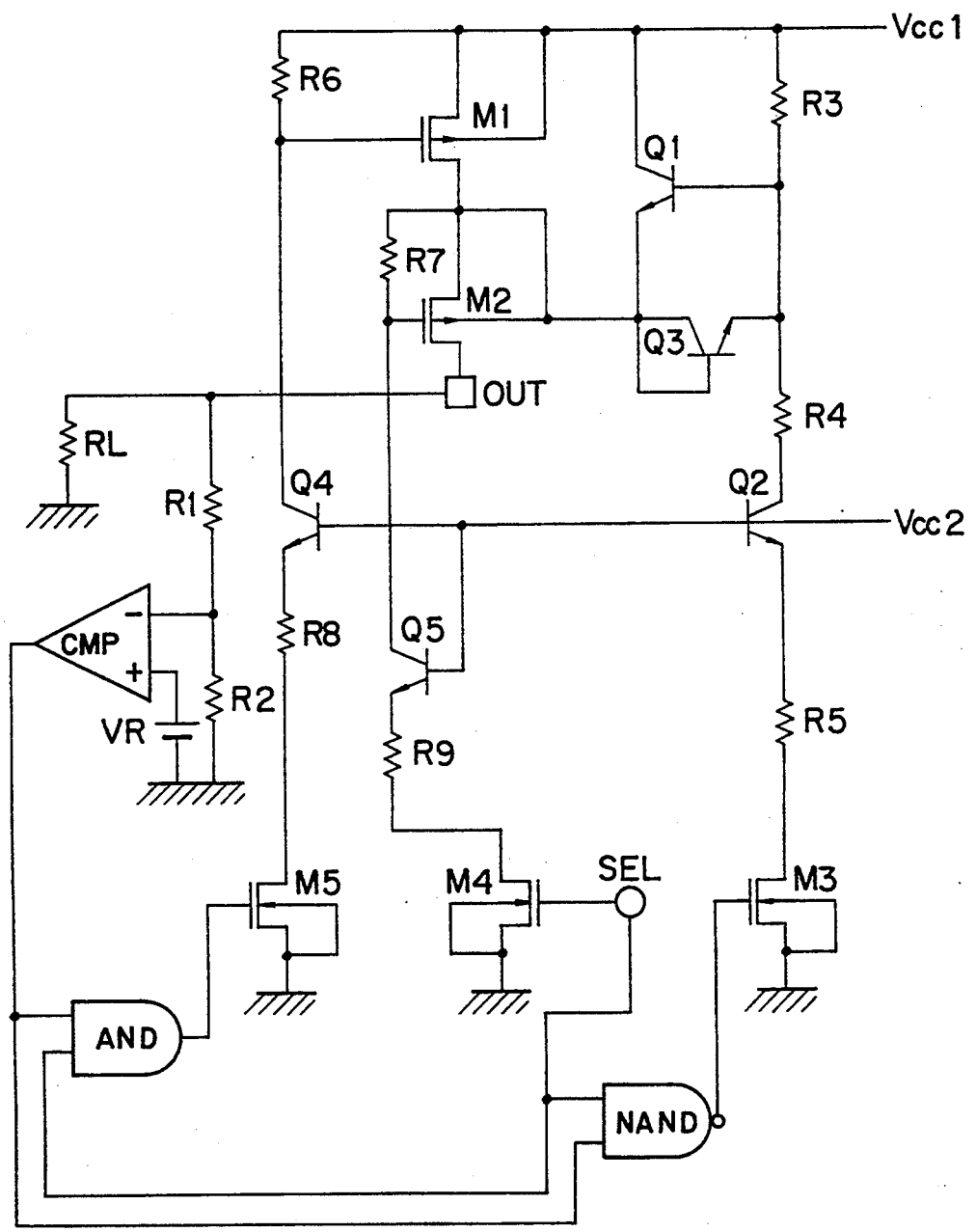
FIG. 3 is a circuit diagram showing a third embodiment of the driver circuit device according to the present invention.
Figure 4:
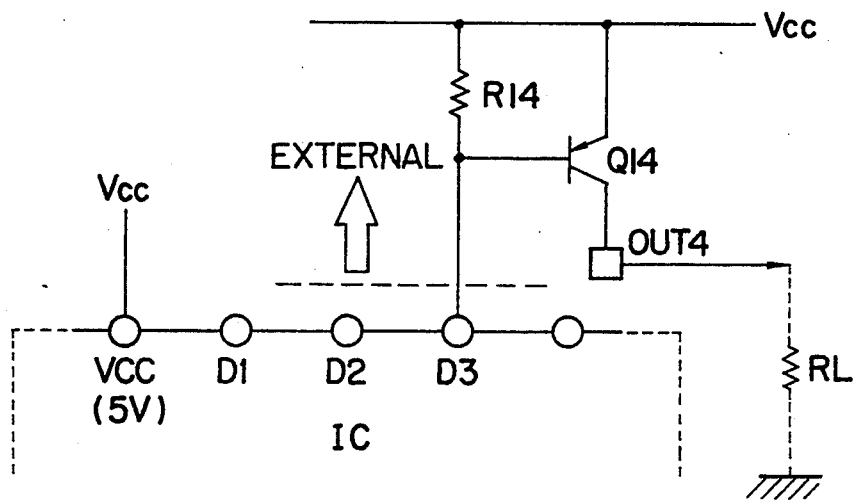
FIG. 4 is a circuit diagram showing a conventional driver circuit device.
Figure 5:
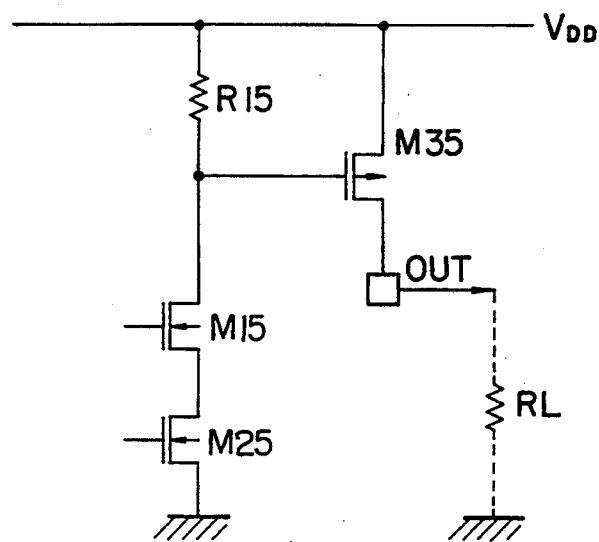
FIG. 5 is a circuit diagram showing another conventional driver circuit device.

FIG. 3 shows a third embodiment of the driver circuit according to the present invention. In FIG. 3, the logical circuit LC shown in FIG. 2 is shown in further detail. Further, the circuit for controlling the gates of the transistors M1 and M2 is shown in further practical way. That is, the circuit shown in FIG. 2 includes transistors Q4, Q5, M4 and M5 and logical circuits, in addition to the circuit shown in FIG. 2. In the drawing, the output of the comparator CMP is given to an AND logical circuit AND and a NAND logical circuit NAND. On the other hand, a signal inputted to the select terminal SEL is also applied to the AND logical circuit AND and the NAND logical circuit NAND, respectively. The output of the AND logical circuit AND is given to the gate of the N-channel transistor M5. On the other hand, the select terminal SEL is connected to the gate of the N-channel transistor M4. The source of the transistor M5 is connected to the ground, and the drain thereof is connected to the emitter of the transistor Q4 via a resistance R8. On the other hand, the source of the transistor M4 is connected to the ground, and the drain thereof is connected to the emitter of the bipolar transistor Q5 via a resistance R9. Further, the collector of the transistor Q4 is connected to the gate of the transistor M1, and the collector of the transistor Q5 is connected to the gate of the transistor M2, respectively. The gate of the transistor M1 is connected to the high potential supply voltage Vcc1 via a resistances R6, and the gate of the transistor M2 is connected to the high potential supply voltage Vcc1 via a resistance R7 and the transistor M1. Further, the bases of the two transistors Q4 and Q5 are connected to the high potential supply voltage Vcc2 together with the base of the transistor Q2. The remaining structure other than those described above is substantially the same as with the case of the second embodiment shown in FIG. 2.

The operation of the driver circuit shown in FIG. 3 will be described hereinbelow.

When no signal is inputted to the select terminal SEL, the output of the NAND logical circuit NAND is set to a high level to turn on the transistor M3. As a result, a current flows from the base to the emitter of the transistor Q2 through the resistance R5 and the transistor M3, so that current flows through the series-connected resistances R3 and R4. Here, the voltage at the junction point between the two resistances R3 and R4 becomes the potential Vbg, as already explained. This potential Vbg is applied to the drain (i.e, the back gate) of the transistor M2 through the transistor Q1. As a result, since only a voltage lower than the high potential supply voltage Vcc1 is applied to the two transistors M1 and M2, it is possible to eliminate the problem with respect to the breakdown voltage of the transistors M1 and M2.

Further, when a signal is inputted to the select terminal SEL, the transistor M4 is turned on. As a result, current flows from the base to the emitter of the transistor Q5 through the resistance R9 and the transistor M4, so that the potential at the gate of the transistor M2 becomes roughly equal to the potential of the high potential supply voltage Vcc2. Consequently, the transistor M2 is turned on, so that the drain potential Vbg of the transistor M2 at this time point is outputted to the output terminal Out. In other words, a load current flows from the output terminal Out to the load resistance RL.

At the same time, current flows through the resistances R1 and R2, so that a voltage develops across the resistance R2. When this voltage exceeds the reference voltage VR, the output of the comparator CMP is inverted to a high level. In response to this high level signal, the outputs of the AND logical circuit AND and the NAND logical circuit NAND are both inverted, respectively. Therefore, the transistor M5 is turned on in response to the high level signal applied from the AND logical circuit AND to the gate thereof. Accordingly, current flows from the base to the emitter of the transistor Q4 through the resistance R8 and the transistor M5, with the result that the potential at the gate of the transistor M1 becomes equal to the potential of the high potential supply voltage Vcc2 to turn on the transistor M1. On the other hand, the output of the NAND logical circuit NAND is inverted to a low level. As a result, the transistor M3 is turned off, so that the voltage Vbg applied to the drain of the transistor M2 rises to a level roughly equal to the high potential supply voltage Vcc1. Under these conditions, however, since both the transistors M1 and M2 are both turned on, a voltage roughly equal to the high potential supply voltage Vcc1 is outputted to the output terminal Out. Consequently, there exists no problem with respect to the breakdown voltage of the transistors M1 and M2.

Further, in FIG. 3, the transistor Q5 and the resistance R9 serve to make the gate potential of the transistor M2 equal to the gate potential of the transistor M1, when the transistors M1 and M2 are both turned on.

In the above-mentioned embodiments, the output terminal Out is driven by two series-connected transistors M1 and M2, by way of example. Without being limited thereto, according to the present invention, it is possible to connect three or more field effect transistors in series, so that voltage higher than the breakdown voltage is not applied to each of these transistors. Further, the circuit for applying voltage to the field effect transistors for the driver circuit is not limited to only the above-mentioned circuits. Any circuits can be adopted, as far as the any given voltage of low impedance can be generated.

As described above, in the driver circuit according to the present invention, since the driver elements small in the margin of breakdown voltage due to microminiaturization of the integrated circuit are connected in series and in addition since the potential is applied to each of the elements under due consideration of the breakdown voltage of each element, it is possible to obtain a driver circuit device provided with the output characteristics higher than the breakdown voltage of the respective elements.

What is claimed is:

1. A driver circuit comprising:
   first and second switching means connected between a first supply voltage and an output terminal for driving a load, in the order of first and second switching means;
   relaxation voltage applying means for applying a voltage lower than the first supply voltage to a junction point between said first and second switching means and a back gate of said second switching means; and
   control means for turning on said second switching means and then said first switching means in sequence when the driver circuit is turned on, and turning off said first switching means and then said second switching means in sequence when the driver circuit is turned off.

2. The diver circuit of claim 1, wherein said control means comprises a comparing circuit for comparing a voltage at the output terminal with a predetermined reference voltage, said first switching means being turned on when said second switching means is inverted in response to an output voltage of said comparing circuit.

3. The driver circuit of claim 1, wherein said control means enables said relaxation voltage applying means to apply the relaxation voltage, prior to the turning-on of said second switching means, when the driver circuit is turned on; and disables said relaxation voltage applying means from applying the relaxation voltage, after the driver circuit has been turned on.

4. The driver circuit of claim 2, wherein said control means enables said relaxation voltage applying means to apply the relaxation voltage, prior to the turning-on of said second switching means, when the driver circuit is turned on; and disables said relaxation voltage applying means from applying the relaxation voltage, after the driver circuit has been turned on.

5. The driver circuit of claim 1, wherein said relaxation voltage applying means comprises circuit elements and third switching means connected in series between a high supply voltage side and a low supply voltage side, the relaxation voltage being generated or interrupted whenever said third switching means is turned on or off by said control means.

6. The driver circuit of claim 2, wherein said relaxation voltage applying means comprises circuit elements and third switching means connected in series between a high supply voltage side and a low supply voltage side, the relaxation voltage being generated or interrupted whenever said third switching means is turned on or off by said control means.

7. The driver circuit of claim 3, wherein said relaxation voltage applying means comprises circuit elements and third switching means connected in series between a high supply voltage side and a low supply voltage side, the relaxation voltage being generated or interrupted whenever said third switching means is turned on or off by said control means.

8. The driver circuit of claim 4, wherein said relaxation voltage applying means comprises circuit elements and third switching means connected in series between a high supply voltage side and a low supply voltage side, the relaxation voltage being generated or interrupted whenever said third switching means is turned on or off by said control means.

9. The driver circuit of claim 5, wherein said relaxation voltage applying means is composed of first and second resistor means and said third switching means connected in series between the high supply voltage side and the low supply voltage side, a junction point between said first and second resistor means being connected to a control terminal of fourth switching means connected between the high supply voltage side and the junction point between said first and second switching means.

10. The driver circuit of claim 6, wherein said relaxation voltage applying means is composed of first and second resistor means and said third switching means connected in series between the high supply voltage side and the low supply voltage side, a junction point between said first and second resistor means being connected to a control terminal of a fourth switching means connected between the high supply voltage side and the junction point between said first and second switching means.

11. The driver circuit of claim 7, wherein said relaxation voltage applying means is composed of first and second resistor means and said third switching means connected in series between the high supply voltage side and the low supply voltage side, a junction point between said first and second resistor means being connected to a control terminal of a fourth switching means connected between the high supply voltage side and the junction point between said first and second switching means.

12. The driver circuit of claim 8, wherein said relaxation voltage applying means is composed of first and second resistor means and said third switching means connected in series between the high supply voltage side and the low supply voltage side, a junction point between said first and second resistor means being connected to a control terminal of a fourth switching means connected between the high supply voltage side and the junction point between said first and second switching means.

13. The driver circuit of claim 9, which further comprises fifth switching means connected between said second resistor means and said third switching means, a second supply voltage lower than the first supply voltage being connected to a control terminal of said fifth switching means.

14. The driver circuit of claim 10, which further comprises a fifth switching means between said second resistor means and said third switching means, a second supply voltage lower than the first supply voltage being connected to a control terminal of said fifth switching means.

15. The driver circuit of claim 11, which further comprises a fifth switching means between said second resistor means and said third switching means, a second supply voltage lower than the first supply voltage being connected to a control terminal of said fifth switching means.

16. The driver circuit of claim 12, which further comprises a fifth switching means between said second resistor means and said third switching means, a second supply voltage lower than the first supply voltage being connected to a control terminal of said fifth switching means.

17. The driver circuit of claim 13, which further comprises reverse bias voltage application preventing means connected between the junction point between said first and second switching means and the junction point between said first and second resistor means, for preventing a reverse bias voltage from being applied to said fourth switching means.

18. The driver circuit of claim 14, which further comprises a reverse bias voltage application preventing means connected between the junction point between said first and second switching means and the junction point between said first and second resistor means, for preventing a reverse bias voltage from being applied to said fourth switching means.

19. The driver circuit of claim 15, which further comprises a reverse bias voltage application preventing means connected between the junction point between said first and second switching means and the junction point between said first and second resistor means, for preventing a reverse bias voltage from being applied to said fourth switching means.

20. The driver circuit of claim 16, which further comprises a reverse bias voltage application preventing means connected between the junction point between said first and second switching means and the junction point between said first and second resistor means, for preventing a reverse bias voltage from being applied to said fourth switching means.

* * * * *